US012588190B2

(12) United States Patent
Kim et al.

(10) Patent No.: US 12,588,190 B2
(45) Date of Patent: Mar. 24, 2026

(54) SEMICONDUCTOR DEVICE WITH A LOW-K SPACER AND METHOD FOR FABRICATING THE SAME

(71) Applicant: SK hynix Inc., Gyeonggi-do (KR)

(72) Inventors: Jun Sik Kim, Gyeonggi-do (KR); Jae Man Yoon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 910 days.

(21) Appl. No.: 17/744,843

(22) Filed: May 16, 2022

(65) Prior Publication Data

US 2023/0164982 A1    May 25, 2023

(30) Foreign Application Priority Data

Nov. 22, 2021    (KR) ......................... 10-2021-0160901

(51) Int. Cl.
*H01L 23/29* (2006.01)
*H10B 12/00* (2023.01)

(52) U.S. Cl.
CPC ......... *H10B 12/482* (2023.02); *H10B 12/315* (2023.02); *H10B 12/34* (2023.02)

(58) Field of Classification Search
CPC .... H10B 12/482; H10B 12/315; H10B 12/34; H10B 12/0335; H10B 12/485; H10B 12/48
See application file for complete search history.

(56) References Cited

U.S. PATENT DOCUMENTS

| | | | |
|---|---|---|---|
| 10,573,652 B2 | 2/2020 | Lee et al. | |
| 2016/0365274 A1* | 12/2016 | Choi | ................. H01L 21/76897 |
| 2019/0296026 A1* | 9/2019 | Ji | ....................... H01L 21/31144 |
| 2023/0035899 A1* | 2/2023 | Lee | ...................... H10B 12/485 |

FOREIGN PATENT DOCUMENTS

KR    10-2021-0018683 A    2/2021

OTHER PUBLICATIONS

Office Action for Korean Patent Application No. 10-2021-0160901 issued by the Korean Patent Office on Sep. 8, 2025.

* cited by examiner

*Primary Examiner* — Samuel Park
(74) *Attorney, Agent, or Firm* — IP&T GROUP LLP

(57) ABSTRACT

Embodiments of present invention provide a semiconductor device capable of reducing parasitic capacitance between neighboring pattern structures and a method for fabricating the same. Also, embodiments of the present invention provide a semiconductor device capable of preventing device deterioration due to carbon diffusion and a method for fabricating the same. According to an embodiment of the present invention, a semiconductor device comprises a bit line structure including a bit line contact plug and a bit line stacked over a substrate; a lower spacer structure including a diffusion barrier layer and a first low-k layer sequentially stacked over both sidewalls of the bit line contact plug; and an upper spacer structure including a second low-k layer over both sidewalk of the bit line.

17 Claims, 8 Drawing Sheets

1

SEMICONDUCTOR DEVICE WITH A LOW-K SPACER AND METHOD FOR FABRICATING THE SAME

CROSS-REFERENCE TO RELATED APPLICATIONS

The present application claims priority to Korean Patent Application No. 10-2021-0160901, filed on Nov. 22, 2021, which is incorporated herein by reference in its entirety.

BACKGROUND

1. Field

The present invention relates to a semiconductor device, and more particularly, to a semiconductor device having a low-k spacer and a method of fabricating the same.

2. Description of the Related Art

In a semiconductor device, an insulating material is formed between neighboring pattern structures. As semiconductor devices are highly integrated, the distance between pattern structures is getting closer. For this reason, parasitic capacitance increases. As the parasitic capacitance increases, the performance of the semiconductor device deteriorates.

Another problem associated with existing semiconductor devices is device degradation because of carbon diffusion. New structures and methods for reducing parasitic capacitance and carbon diffusion are therefore needed.

SUMMARY

Embodiments of the present invention provide a semiconductor device capable of reducing parasitic capacitance between adjacent pattern structures and a method of fabricating the same.

In addition, embodiments of the present invention provide a semiconductor device capable of preventing device degradation due to carbon diffusion and a method of fabricating the same.

According to an embodiment of the present invention, a semiconductor device comprises: a bit line structure including a bit line contact plug and a bit stacked over a substrate; a lower spacer structure including a diffusion barrier layer and a first low-k layer sequentially stacked over both sidewalls of the bit line contact plug; and an upper spacer structure including a second low-k layer over both sidewalls of the bit line.

According to an embodiment of the present invention, a semiconductor device comprises: a pattern structure including a first conductive pattern and a second conductive pattern stacked over a substrate; a lower spacer structure including a diffusion barrier layer and a first low-k layer sequentially stacked over both sidewalls of the first conductive pattern; and an upper spacer structure including a second low-k layer over both sidewalls of the second conductive pattern.

According to an embodiment of the present invention, a method of fabricating a semiconductor device, the method comprises: forming a bit line structure including a bit line contact plug and a bit line stacked over a substrate; forming a lower spacer structure including a diffusion barrier layer and a first low-k layer sequentially stacked over both sidewalls of the bit line contact plug; and forming an upper spacer structure including a second low-k layer over both sidewalls of the bit line.

The present technology can prevent carbon diffusion and reduce parasitic capacitance at the same time by applying the bit line contact plug spacer and the bit line spacer differently.

These and other features and advantages of the present invention will become apparent to the skilled person from the following detailed description of example embodiments of the invention in conjunction with the following drawings.

DETAILED DESCRIPTION

Figure 1:
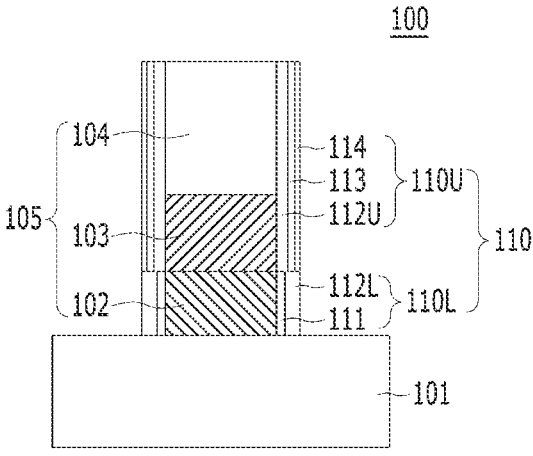
FIG. 1 is a diagram illustrating a semiconductor device according to an embodiment of the present invention.

Various embodiments described herein will be described with reference to cross-sectional views, plan views and block diagrams, which are ideal schematic views of the present invention. Therefore, the structures of the drawings may be modified by fabricating technology and/or tolerances. Therefore, any regions and shapes of regions illustrated in the drawings have schematic views, are intended to illustrate specific examples of structures of regions of the various elements, and are not intended to limit the scope of the invention. Sizes and relative sizes of components shown in the drawings may be exaggerated for clarity of description. The same reference numerals refer to the same elements throughout the specification, and "and/or" includes each and every combination of one or more of the recited items.

Reference to an element or layer "on" or "over" another element or layer includes not only the case where an element or layer is directly on the other element or layer, but also the case where an element or layer includes other layers or other elements therebetween. The terminology used herein is for the purpose of describing the embodiments and is not intended to limit the present invention. In this specification, the singular also includes the plural unless specifically stated otherwise in the phrase.

FIG. 1 is a diagram illustrating a semiconductor device according to an embodiment of the present invention.

Referring to FIG. 1, a semiconductor device 100 may include a substrate 101, a pattern structure 105, and spacer structures 110. The spacer structures 110 may be formed over both sidewalls of the pattern structure 105.

A pattern structure 105 may be formed on the substrate 101. The pattern structure 105 may include a first conductive pattern 102 formed on the substrate 101. The pattern structure 105 may further include a second conductive pattern 103 formed on the first conductive pattern 102 and a hard mask pattern 104 formed on the second conductive pattern 103. The first conductive pattern 102 may directly contact the substrate 101. The first conductive pattern 102 and the substrate 101 may be electrically separated by a separation material or an insulating material layer. The first conductive pattern 102 and the second conductive pattern 103 may include polysilicon, metal, metal nitride, metal silicide, or a combination thereof. The hard mask pattern 104 may include an insulating material.

The spacer structure 110 may include a multi-layer of insulating materials. The spacer structure 110 may include a lower spacer structure 110L and an upper spacer structure 110U. The upper spacer structure 110U may be located over both sidewalls of the second conductive pattern 103 and the hard mask pattern 104 of the pattern structure 105 and may extend long in any one direction. In the longitudinal direction of the pattern structure 105, the lower spacer structure 110L may be disposed over both sidewalls of the first conductive pattern 102 of the pattern structure 105. The upper spacer structure 110U may be disposed at a higher level than the lower spacer structure 110L. The lower spacer structure 110L and the upper spacer structure 110U may include an integrated common portion. The integral common part may be vertically continuous from the lower spacer structure 110L to the upper spacer structure 110U. The lower spacer structure 110L and the upper spacer structure 110U may include different structures or different materials.

The lower spacer structure 110L may include a stack of a first lower-spacer 111 and a second lower-spacer 112L having a lower dielectric constant than that of the first lower-spacer 111. The first lower-spacer 111 may have a first dielectric constant, and the second lower-spacer 112L may have a second dielectric constant. The second dielectric constant may have a lower value than the first dielectric constant. The second lower-spacer 112L may have a lower dielectric constant than the first lower-spacer 111. The first dielectric constant may be about 7.5, and the second dielectric constant may be lower than 7. For example, the second dielectric constant may be 4.4 or less. The second lower-spacer 112L may include a low-k material. The first lower-spacer 111 may have a higher dielectric constant than the low dielectric constant material. The second lower-spacer 112L may have a lower dielectric constant than that of silicon oxide. The first lower-spacer 111 may include silicon nitride. The second lower-spacer 112L may have a lower dielectric constant than that of silicon oxide.

The first lower-spacer 111 and the second lower-spacer 112L may include a silicon-based material. The first lower-spacer 111 and the second lower-spacer 112L may include a silicon-based dielectric material. The first lower-spacer 111 may not contain impurities, and the second lower-spacer 112L may contain impurities. Since the second lower-spacer 112L contains impurities, the dielectric constant of the second lower-spacer 111 may be lower than that of the first lower-spacer 111. The first lower-spacer 111 may include an impurity-free silicon-based material, and the second lower-spacer 112L may include an impurity-containing silicon-based material. The second lower-spacer 112L may include carbon as an impurity. For example, the second lower-spacer 112L may include SiCO.

In particular, the first lower-spacer 111 of this embodiment may prevent the impurities in the second lower-spacer 112L from being diffused into the first conductive pattern 102 and/or the substrate 101 by a subsequent thermal process or the like. The first lower-spacer 111 may be referred to as a 'diffusion barrier layer.' The first lower-spacer 111 may be formed to have a sufficient thickness to prevent out-diffusion of carbon. The first lower-spacer 111 may be formed to have a thickness that can ensure film uniformity. Here, the uniformity refers to a characteristic of maintaining a thickness sufficient to prevent out-diffusion of impurities in the second lower-spacer 112L over all of the first lower-spacer 111. For example, the first lower-spacer 111 may be formed to a thickness of greater than 10 Å. In another example, the first lower-spacer 111 may be formed to a thickness of 20 Å or more.

As a comparative example, when the first lower-spacer 111 is formed to have a thickness of 10 Å or less, the impurities in the second lower-spacer 112L may not be prevented from diffusing into the first conductive pattern 102 and/or the substrate 101 because the first lower-spacer 111 is not uniformly formed on the entire surface, that is, both sidewalls of the first conductive pattern 102, and a portion of the surface has a relatively smaller thickness.

In contrast, in the present embodiment, the first lower-spacer 111 has a thickness that can maintain the uniformity of the film and the second lower-spacer 112L has a low dielectric constant. Thus, the impurities of the second lower-spacer 112L may be prevented from diffusing into the first conductive pattern 102 and/or the substrate 101 and the parasitic capacitance between the conductive patterns may be reduced.

The upper spacer structure 110U may include a stack of a first upper spacer 112U, a second upper spacer 113, and a third upper spacer 114. The first upper spacer 112U may be integrated with the second lower spacer 112L. The second lower spacers 112L may be vertically continuous from the first upper spacer 112U. The first upper spacer 112U may be made of the same material as the second lower spacer 112L. The first upper spacer 112U may include an impurity-containing silicon-based material. The first upper spacer 112U may include carbon as an impurity. For example, the first upper spacer 112U may include SiCO. The second upper spacer 113 may include, for example, silicon oxide. The third upper spacer 114 may include, for example, silicon nitride. The third upper spacer 114 may have a thickness smaller than each of the thicknesses of the first upper spacer 112U and the second upper spacer 113.

In particular, in this embodiment, the lower spacer structure 110L and the upper spacer structure 110U may be formed differently to prevent R/H (Row hammer) deterioration due to impurity diffusion and at the same time reduce parasitic capacitance of the device.

More specifically, in the present embodiment, the lower spacer structure 110L may include the first lower-spacer 111 for preventing impurity diffusion between the second lower-spacer 112L including a low-k material and the first conductive pattern 102. That is, the lower spacer structure 110L may include a nitride-low k (NK) structure. The NK structure may be formed by a stack of the first lower-spacer 111/second lower-spacer 112L. An example of the NK structure may include a stack of silicon nitride/low-k material. Another example of an NK structure may include a stack of silicon nitride/impurity-containing silicon-based material. An example of an NK structure may include a stack of $Si_3N_4/SiCO$.

The upper spacer structure 110U may have a Low K-Oxide-Nitride (KON) structure where the first upper spacer 112U including a low-k material is in contact with the sidewall of the second conductive pattern 103 to prevent an increase in parasitic capacitance due to the high dielectric constant. The KON structure may be formed by a stack of the first upper spacer 112U/the second upper spacer 113/the third upper spacer 114. An example of the KON structure may include a stack of a low-k material/silicon oxide/silicon nitride. Another example of the KON structure may include a stack of impurity-containing silicon-based material/silicon oxide/silicon nitride. An example of a KON structure may include a stack of $SiCO/SiO_2/Si_3N_4$.

As a comparative example, when the first lower-spacer 111 for forming the lower spacer structure 110L is formed to extend vertically to the sidewall of the second conductive pattern 103 without being removed, the parasitic capacitance of the device may be increased because the thickness of the spacer occupied by the low-k material is relatively reduced.

In contrast, in this embodiment, the lower spacer structure 110L applies the NK structure to prevent impurities in the low-k layer diffusing into the conductive pattern and/or the substrate, and the upper spacer structure 110U applies the KON structure. Thus, the parasitic capacitance between the conductive patterns can be minimized.

Figure 2:
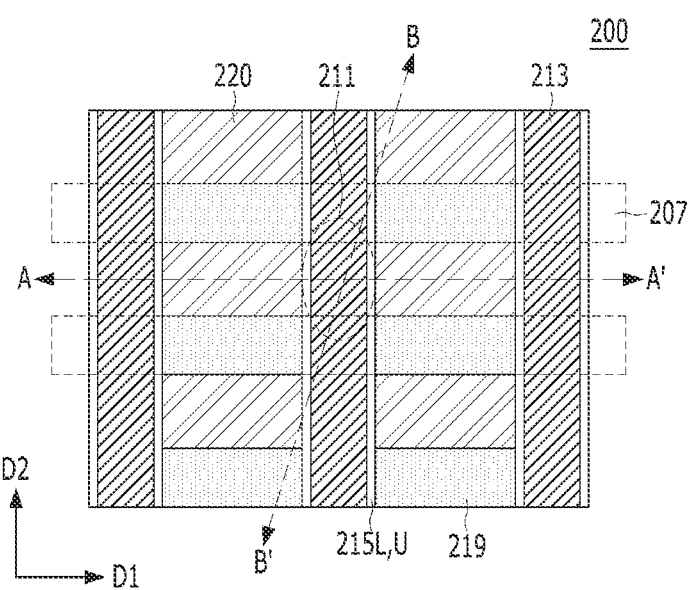
FIG. 2 is a plan view of a semiconductor device according to an embodiment of the present invention.
Figure 3A:
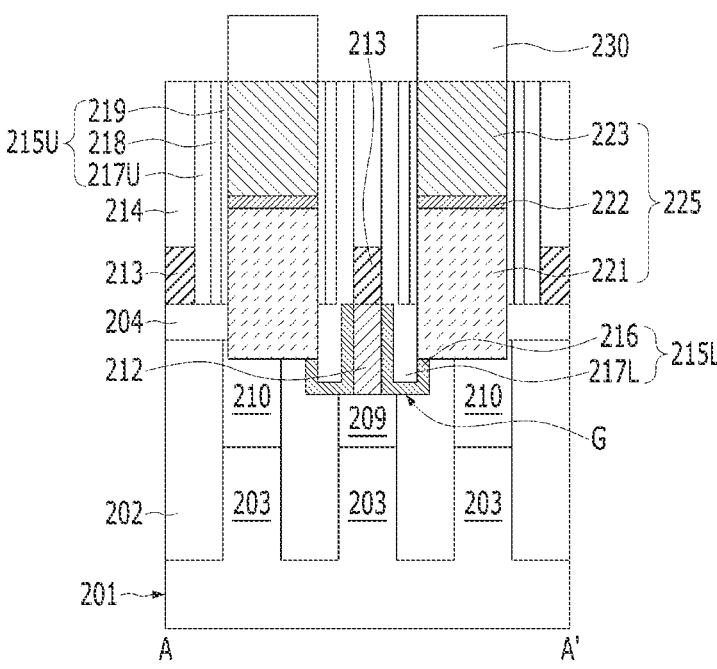
FIGS. 3A and 3B are cross-sectional views of a semiconductor device according to an embodiment of the present invention.
Figure 3B:
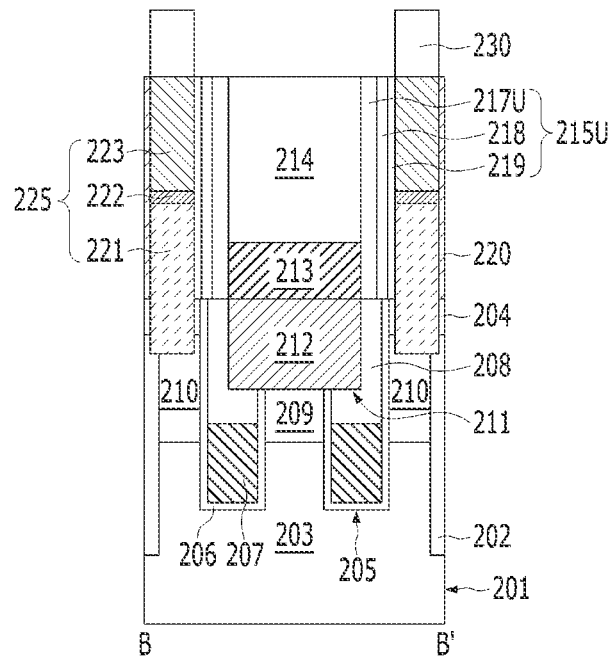

FIG. 2 is a plan view of a semiconductor device according to an embodiment of the present invention. FIGS. 3A and 3B are cross-sectional views of a semiconductor device according to an embodiment of the present invention. FIG. 3A is a cross-sectional view taken along line A-A' of FIG. 2. FIG. 3B is a cross-sectional view taken along line B-B' of FIG. 2.

Referring to FIGS. 2, 3A, and 3B, a semiconductor device 200 may include a plurality of memory cells. Each memory cell may include a cell transistor including a buried word line 207, a bit line structure and a memory element 230. The semiconductor device 200 will be described in detail.

A device isolation layer 202 and an active region 203 may be formed on the substrate 201. A plurality of active regions 203 may be defined by the device isolation layer 202. The substrate 201 may be a material suitable for semiconductor processing. The substrate 201 may include a semiconductor substrate. The substrate 201 may be made of a material containing silicon. The substrate 201 may include silicon, monocrystalline silicon, polysilicon, amorphous silicon, silicon germanium, monocrystalline silicon germanium, polycrystalline silicon germanium, carbon doped silicon, combinations thereof, or multiple layers thereof. The substrate 201 may include other semiconductor materials such as germanium. The substrate 201 may include a III/V group semiconductor substrate, for example, a compound semiconductor substrate such as gallium arsenide (GaAs). The substrate 201 may include a silicon on insulator (SOI) substrate. The device isolation layer 202 may be formed by a shadow trench isolation (STI) process.

A gate trench 205 may be formed in the substrate 201. A gate insulating layer 206 may be formed on the surface of the gate trench 205. A buried word line 207 may be formed on the gate insulating layer 206 to partially fill the gate trench 205. A gate capping layer 208 may be formed on the buried word line 207. The upper surface of the buried word line 207 may be at a level lower than the surface of the substrate 201. The buried word line 207 may be made of a low-resistivity metal. In the buried word line 207, titanium nitride and tungsten may be sequentially stacked. In another embodiment, the buried word line 207 may be formed of titanium nitride only (TiN only). The buried word line 207 may be referred to as a 'buried gate electrode'. The buried word line 207 may extend long in the first direction D1.

First and second impurity regions 209 and 210 may be formed in the substrate 201. The first and second impurity regions 209 and 210 may be spaced apart from each other by the gate trench 205. The first and second impurity regions 209 and 210 may be referred to as source/drain regions. The first and second impurity regions 209 and 210 may include N-type impurities such as arsenic (As) or phosphorus (P). Accordingly, the buried word line 207 and the first and second impurity regions 209 and 210 may become a cell transistor. The cell transistor may improve the short channel effect with the buried word line 207.

A bit line contact plug 212 may be formed on the substrate 201. The bit line contact plug 212 may be connected to the first impurity region 209. The bit line contact plug 212 may be located in the bit line contact hole 211. The bit line contact hole 211 may extend to the substrate 201 through the hard mask layer 204. The hard mask layer 204 may be formed on the substrate 201. The hard mask layer 204 may include an insulating material. The bit line contact hole 211 may expose the first impurity region 209. A lower surface of the bit line contact plug 212 may be lower than upper surfaces of the device isolation layer 202 and the active region 203. The bit line contact plug 212 may be formed of polysilicon or a metal. A portion of the bit line contact plug 212 may have a line width smaller than a diameter of the bit line contact hole 211. A bit line 213 may be formed on the bit line contact plug 212. A bit line hard mask 214 may be formed on the bit line 213. The stacked structure of the bit line contact plug 212, the bit line 213, and the bit line hard mask 214 may be referred to as a 'bit line structure.' The bit line 213 may have a line shape extending in the second direction D2 crossing the buried word line 207. A portion of the bit line 213 may be connected to the bit line contact plug 212. When viewed in the A-A' direction, the bit line 213 and the bit line contact plug 212 may have the same line width. Accordingly, the bit line 213 may extend in the second direction D2 while covering the bit line contact plug 212. The bit line 213 may include a metal such as tungsten. The bit line hard mask 214 may include an insulating material such as silicon nitride.

Spacer structures 215L and 215U may be formed on sidewalls of the bit line structure. Each of the spacer structures 215L and 215U may include a multi-layered insulating material. The spacer structures 215L and 215U may include a lower spacer structure 215L and an upper spacer structure 215U. The upper spacer structure 215U is positioned over both sidewalls of the bit line 213 and over both sidewalls of the bit line hard mask 214, but may extend long in either direction. The lower spacer structure 215L may be positioned over both sidewalls of the bit line contact plug 212. The upper spacer structure 215U may be located at a higher level than the lower spacer structure 215L. The lower spacer structure 215L and the upper spacer structure 215U may include an integrated common portion. The integrated common portion may be vertically continuous from the lower spacer structure 215L to the upper spacer structure 215U. The lower spacer structure 215L and the upper spacer structure 215U may include different structures or different materials from each other.

A storage node contact plug 225 may be formed between adjacent bit line structures. The storage node contact plug 225 may be connected to the second impurity region 210. The storage node contact plug 225 may include a lower plug 221 and an upper plug 223. The storage node contact plug 225 may further include an ohmic contact layer 222 between the lower plug 221 and the upper plug 223. The ohmic contact layer 222 may include metal silicide. For example, the lower plug 221 may include polysilicon, and the upper plug 223 may include a metal nitride, a metal, or a combination thereof.

When viewed from a direction parallel to the bit line structure, the plug isolation layer 220 may be formed between the adjacent storage node contact plugs 225. The plug isolation layer 220 may be formed between adjacent bit line structures. The adjacent storage node contact plugs 225 may be spaced apart from each other by the plug isolation layers 220. A plurality of plug isolation layers 220 and a plurality of storage node contact plugs 225 may be alternately positioned between adjacent bit line structures.

The plug isolation layer 220 may include silicon nitride or a low-k material. The plug isolation layer 220 may include SiC, SiCO, SiCN, SiOCN, SiBN, or SiBCN.

A memory element 230 may be formed on the upper plug 223. The memory element 230 may include a capacitor including a storage node. The storage node may include a pillar type. A dielectric layer and a plate node may be further formed on the storage node. The storage node may have a cylinder type other than the pillar type.

A closer look at the spacer structures 215L and 215U is as follows.

The lower-spacer structure 215L may include a stack of a first lower-spacer 216 and a second lower-spacer 217L having a lower dielectric constant than that of the first lower-spacer 216. The first lower-spacer 216 may have a first dielectric constant, and the second lower-spacer 217L may have a second dielectric constant. The second dielectric constant may have a lower value than the first dielectric constant. The second lower-spacer 217L may have a lower dielectric constant than the first lower-spacer 216. The first dielectric constant may be about 7.5, and the second dielectric constant may be lower than 7. For example, the second dielectric constant may be 4.4 or less. The second lower-spacer 217L may include a low-k material. The first lower-spacer 216 may have a higher dielectric constant than the low-k material. The second lower-spacer 217L may have a lower dielectric constant than that of silicon oxide. The first lower-spacer 216 may include silicon nitride. The second lower-spacer 217L may have a lower dielectric constant than that of silicon oxide.

The first lower-spacer 216 and the second lower-spacer 217L may include a silicon-based material. The first lower-spacer 216 and the second lower-spacer 217L may include a silicon-based dielectric material. The first lower-spacer 216 may not contain impurities, and the second lower-spacer 217L may contain impurities. The second lower-spacer 217L may have a lower dielectric constant than the first lower-spacer 216. The first lower-spacer 216 may include an impurity-free silicon-based material, and the second lower-spacer 217L may include an impurity-containing silicon-based material. The second lower-spacer 217L may include carbon as an impurity. For example, the second lower-spacer 217L may include SiCO.

In particular, the first lower-spacer 216 of this embodiment may prevent diffusion of impurities contained in the second lower-spacer 217L from the second lower-spacer 217L to the bit line contact plug 212 and/or the substrate 201 by a subsequent thermal process or the like. The first lower-spacer 216 may be referred to as a 'diffusion barrier layer.' The first lower-spacer 216 may be formed to have a sufficient thickness to prevent out-diffusion of carbon. The first lower-spacer 216 may be formed to have a thickness that can ensure film uniformity. Here, the uniformity refers to a characteristic of maintaining a thickness sufficient to prevent out-diffusion of impurities from the second lower-spacer 217L over the entire first lower-spacer 216. For example, the first lower-spacer 216 may be formed to a thickness of greater than 10 Å. In another example, the first lower-spacer 216 may be formed to a thickness of 20 Å or more.

As a comparative example, when the first lower-spacer 216 is formed to have a thickness of 10 Å or less, the first lower spacer 216 is not uniformly formed on the entire surface, that is, over both sides of the bit line contact plug 212. Therefore, the impurities present in the second lower spacer 217L may not be prevented from diffusing into the bit line contact plug 212 and/or the substrate 201 due to a portion not having a relatively sufficient thickness.

In contrast, in the present embodiment, the first lower-spacer 216 is applied to a thickness that can maintain the film uniformity and the second lower-spacer 217L having a low dielectric constant is applied. Therefore, the impurities of the second lower-spacer 217L may be prevented from diffusing into the bit line contact plug 212 and/or the substrate 201, and at the same time may reduce the parasitic capacitance between the bit line contact plug 212 and the storage node contact plug 225.

The upper spacer structure 215U may include a stack of a first upper spacer 217U, a second upper spacer 218, and a third upper spacer 219. The first upper spacer 217U may be integrated with the second lower spacer 217L. The second lower spacer 217L may be vertically continuous from the first upper spacer 217U. The first upper spacer 217U may be made of the same material as the second lower spacer 217L. The first upper spacer 217U may include an impurity-containing silicon-based material. The first upper spacer 217U may include carbon as an impurity. For example, the first upper spacer 217U may include SiCO. The second upper spacer 218 may include, for example, silicon oxide. The third upper spacer 219 may include, for example, silicon nitride. The third upper spacer 219 may have a thickness smaller than those of the first upper spacer 217U and the second upper spacer 218.

In particular, in this embodiment, the lower spacer structure 215L and the upper spacer structure 215U may be formed differently to prevent R/H (Row hammer) deterioration due to impurity diffusion and, at the same time, to reduce parasitic capacitance of the device.

More specifically, in the present embodiment, the lower spacer structure 215L may include a first lower spacer 216 between the second lower spacer 217L including a low-k material and the bit line contact plug 212 to prevent impurity diffusion. That is, the lower spacer structure 215L may include a nitride-low k (NK) structure. The NK structure may be formed by a stack of the first lower-spacer 216/the second lower-spacer 217L. An example of the NK structure may include a stack of silicon nitride/low-k material. Another example of an NK structure may include a stack of silicon nitride/impurity-containing silicon-based material. An example of an NK structure may include a stack of $Si_3N_4/SiCO$.

The upper spacer structure 215U may include a low-k-oxide-nitride (KON) structure in which the first upper spacer 217U including a low-k material is in contact with sidewalls of the bit line 213 and the bit line hard mask 214 to prevent an increase in parasitic capacitance due to high dielectric constant. The KON structure may be formed by a stack of the first upper spacer 217U/the second upper spacer 218/the third upper spacer 219. An example of the KON structure may include a stack of a low-k material/silicon oxide/silicon nitride. Another example of the KON structure may include a stack of impurity-containing silicon-based material/silicon oxide/silicon nitride. An example of a KON structure may include a stack of $SiCO/SiO_2/Si_3N_4$.

As a comparative example, when the first lower-spacer 216 for forming the lower-spacer structure 215L is formed to extend vertically to the sidewall of the bit line 213 without removing the first lower spacer 216, the thickness of the spacer occupied by the low-k material is relatively reduced. Thus, the parasitic capacitance between the bit line structures may be increased.

On the other hand, in the present embodiment, the lower spacer structure 215L may reduce parasitic capacitance between the bit line contact plug 212 and/or the bit line contact plug 225 by applying the NK structure to prevent diffusion of impurities in the low-k layer into the bit line contact plug 212 and/or the substrate 201 and the upper spacer structure 215U may minimize the parasitic capacitance between the bit line structures by applying a KON structure.

FIGS. 4 to 15 are cross-sectional views illustrating a method of fabricating a semiconductor device according to an embodiment of the present invention. FIGS. 4 to 15 are cross-sectional views illustrating a method of fabricating a semiconductor device according to lines A-A' and B-B' of FIG. 2.

Figure 4:
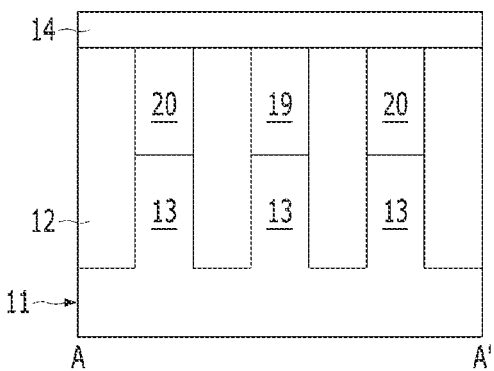
FIGS. 4 to 15 are cross-sectional views illustrating a method of fabricating a semiconductor device according to an embodiment of the present invention.
Figure 4:
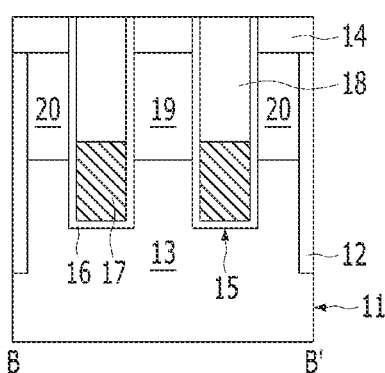

As shown in FIGS. 2 and 4, the device isolation layer 12 may be formed on the substrate 11. A plurality of active regions 13 are defined by the device isolation layer 12. The device isolation layer 12 may be formed by a shallow trench isolation (STI) process. The STI process may be as follows. The substrate 11 is etched to form an isolation trench (reference numeral omitted). The isolation trench is filled with an insulating material, and thus the device isolation layer 12 is formed. The device isolation layer 12 may include silicon oxide, silicon nitride, or a combination thereof. Chemical vapor deposition (CVD) or other deposition processes may be used to fill the isolation trench with an insulating material. A planarization process such as chemical mechanical polishing (CMP) may additionally be used.

Next, a buried word line structure may be formed in the substrate 11. The buried word line structure may include a gate trench 15, a gate insulating layer 16 covering the bottom surface and sidewalls of the gate trench 15, and a buried word line 17 partially filling the gate trench 15 on the gate insulating layer 16, and a gate capping layer 18 formed on the buried word line 17.

A method of forming the buried word line structure may be as follows.

First, a gate trench 15 may be formed in the substrate 11. The gate trench 15 may have a line shape crossing the active regions 13 and the device isolation layer 12. The gate trench 15 may be formed by forming a mask pattern on the substrate 11 and by an etching process using the mask pattern as an etching mask. In order to form the gate trench 15, the hard mask layer 14 may be used as an etch barrier. The hard mask layer 14 may have a shape patterned by a mask pattern. The hard mask layer 14 may include silicon oxide. The hard mask layer 14 may include tetra ethyl ortho silicate (TEOS). The bottom of the gate trench 15 may be at a higher level than the bottom of the device isolation layer 12.

A portion of the device isolation layer 12 may be recessed to protrude the active region 13 under the gate trench 15. For example, in the direction B-B' of FIG. 3, the device isolation layer 12 under the gate trench 15 may be selectively recessed. Accordingly, a fin region (reference numeral omitted) under the gate trench 15 may be formed. The fin region may be a part of the channel region.

Next, a gate insulating layer 16 may be formed on the bottom surface and sidewalls of the gate trench 15. Before the gate insulating layer 16 is formed, the etch damage on the surface of the gate trench 15 may be cured. For example, after the sacrificial oxide is formed by thermal oxidation, the sacrificial oxide may be removed.

The gate insulating layer 16 may be formed by thermal oxidation. For example, the gate insulating layer 16 may be formed by oxidizing the bottom surface and sidewalls of the gate trench 15.

In another embodiment, the gate insulating layer 16 may be formed by a deposition method such as chemical vapor deposition (CVD) or atomic layer deposition (ALD). The gate insulating layer 16 may include a high-k material, oxide, nitride, oxynitride, or a combination thereof. The high-k material may include hafnium oxide. The hafnium-containing material may include hafnium oxide, hafnium silicon oxide, hafnium silicon oxynitride, or a combination thereof. In another embodiment, the high-k material may include lanthanum oxide, lanthanum aluminum oxide, zirconium oxide, zirconium silicon oxide, zirconium silicon oxynitride, aluminum oxide, and combinations thereof.

In another embodiment, the gate insulating layer 16 may be formed by depositing liner polysilicon and then radically oxidizing the liner polysilicon layer.

In another embodiment, the gate insulating layer 16 may be formed by radically oxidizing the liner silicon nitride layer after forming a liner silicon nitride layer.

Next, a buried word line 17 may be formed on the gate insulating layer 16. To form the buried word line 17, a recessing process may be performed after a conductive layer is formed to fill the gate trench 15. The recessing process may be performed as an etchback process, or a chemical mechanical polishing (CMP) process and an etchback process may be sequentially performed. The buried word line 17 may have a recessed shape that partially fills the gate trench 15. That is, the upper surface of the buried word line 17 may be at a lower level than the upper surface of the active region 13. The buried word line 17 may include a metal, a metal nitride, or a combination thereof. For example, the buried word line 17 may be formed of a titanium nitride (TiN), tungsten (W), or titanium nitride/tungsten (TiN/W) stack. The titanium nitride/tungsten (TiN/W) stack may have a structure in which titanium nitride is conformally formed and then the gate trench 15 is partially filled with tungsten. As the buried word line 17, titanium nitride may be used alone, and this may be referred to as the buried word line 17 having a "TiN Only" structure. A double gate structure of a titanium nitride/tungsten (TiN/W) stack and a polysilicon layer may be used as the buried word line 17.

Next, a gate capping layer 18 may be formed on the buried word line 17. The gate capping layer 18 may include an insulating material. The remaining portion of the gate trench 15 on the buried word line 17 is filled with a gate capping layer 18. The gate capping layer 18 may include silicon nitride. In another embodiment, the gate capping layer 18 may include silicon oxide. In another embodiment, the gate capping layer 18 may have a Nitride-Oxide-Nitride (NON) structure. The upper surface of the gate capping layer 18 may be at the same level as the upper surface of the hard mask layer 14. To this end, a CMP process may be performed for forming the gate capping layer 18.

After the gate capping layer 18 is formed, impurity regions 19 and 20 may be formed. The impurity regions 19 and 20 may be formed by a doping process such as implantation. The impurity regions 19 and 20 may include a first impurity region 19 and a second impurity region 20. The first and second impurity regions 19 and 20 may be doped with impurities of the same conductivity type. The first and second impurity regions 19 and 20 may have the same depth. In another embodiment, the first impurity region 19 may be deeper than the second impurity region 20. The first and second impurity regions 19 and 20 may be referred to as source/drain regions. The first impurity region 19 may be a region to which a bit line contact plug is to be connected. The first impurity region 19 and the second impurity region 20 may be located in different active regions 13. In addition, the first impurity region 19 and the second impurity region 20 may be spaced apart from each other by the gate trenches 15 and positioned in each of the active regions 13.

A cell transistor of a memory cell may be formed by the buried word line 17 and the first and second impurity regions 19 and 20.

Figure 5:
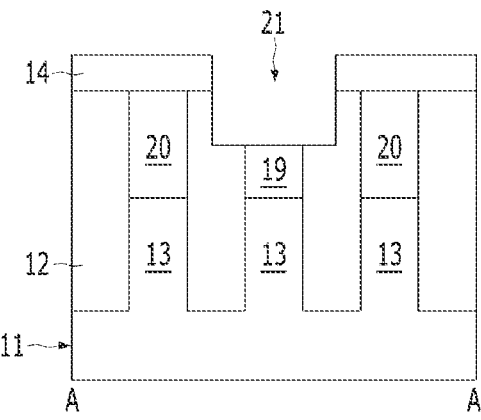
Figure 5:
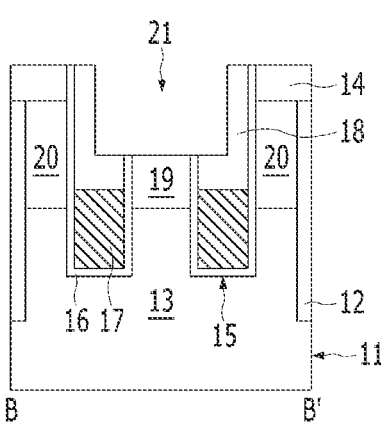

As shown in FIGS. 2 and 5, a bit line contact hole 21 may be formed. The hard mask layer 14 may be etched using a contact mask to form the bit line contact hole 21. The bit line contact hole 21 may have a circle shape or an elliptical shape when viewed in a plan view. A portion of the substrate 11 may be exposed through the bit line contact hole 21. The bit line contact hole 21 may have a diameter controlled to a predetermined line width. The bit line contact hole 21 may have a shape exposing a portion of the active region 13. For example, the first impurity region 19 is exposed by the bit line contact hole 21. The bit line contact hole 21 has a diameter greater than the width of the minor axis of the active region 21. Accordingly, in the etching process for forming the bit line contact hole 21, portions of the first impurity region 19, the device isolation layer 12, and the gate capping layer 18 may be etched. That is, the gate capping layer 18, the first impurity region 19, and the device isolation layer 12 under the bit line contact hole 21 may be recessed to a predetermined depth. Accordingly, the bottom of the bit line contact hole 21 may be extended into the substrate 11. As the bit line contact hole 21 extends, the surface of the first impurity region 19 may be recessed, and the surface of the first impurity region 19 may be at a level lower than the surface of the active region 13.

Figure 6:
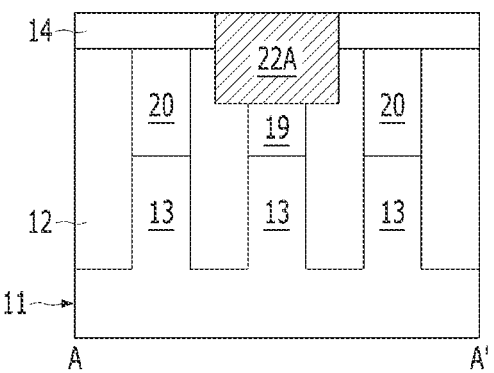
Figure 6:
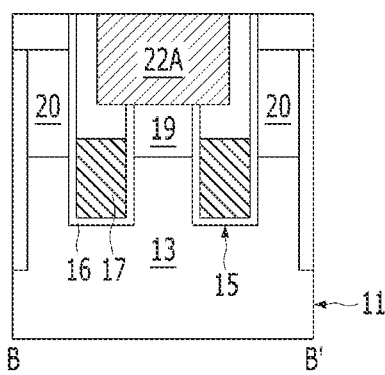

As shown in FIGS. 2 and 6, a preliminary plug (or "pre-plug") 22A is formed. The pre-plug 22A may be formed by selective epitaxial growth (SEG). For example, the pre-plug 22A may include an epitaxial layer doped with phosphorus, for example, SEG SiP. In this way, the pre-plug 22A may be formed without having voids by selective epitaxial growth. In another embodiment, the pre-plug 22A may be formed by polysilicon layer deposition and a CMP process. The pre-plug 22A may fill the bit line contact hole 21. The upper surface of the pre-plug 22A may be at the same level as the upper surface of the hard mask layer 14.

Figure 7:
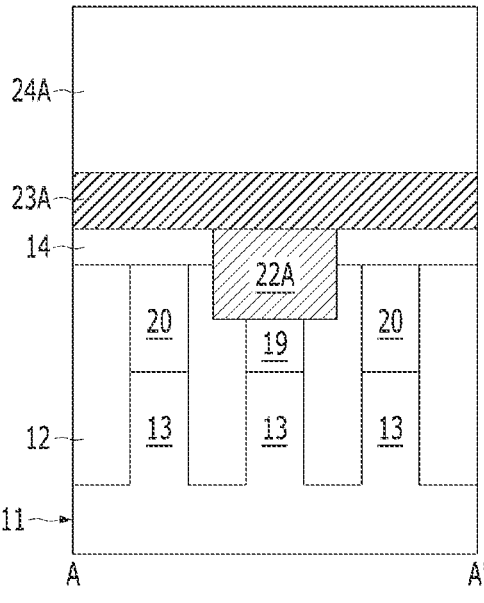
Figure 7:
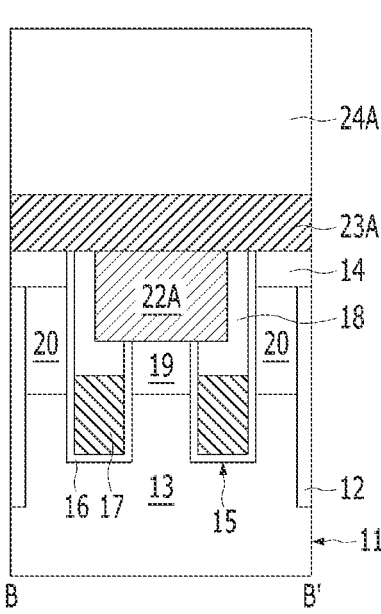

As shown in FIGS. 2 and 7, a bit line conductive layer 23A and a bit line hard mask layer 24A may be stacked. A bit line conductive layer 23A and a bit line hard mask layer 24A may be sequentially stacked on the pre-plug 22A and the hard mask layer 14. The bit line conductive layer 23A may include a metal-containing material. The bit line conductive layer 23A may include a metal, a metal nitride, a metal silicide, or a combination thereof. In this embodiment, the bit line conductive layer 23A may include tungsten (W). In another embodiment, the bit line conductive layer 23A may include a stack of titanium nitride and tungsten (TiN/W). In this case, the titanium nitride may serve as a barrier. The bit line hard mask layer 24A may be formed of an insulating material having an etch selectivity with respect to the bit line conductive layer 23A and the pre-plug 22A. The bit line hard mask layer 24A may include silicon oxide or silicon nitride. In this embodiment, the bit line hard mask layer 24A may be formed of silicon nitride.

Figure 8:
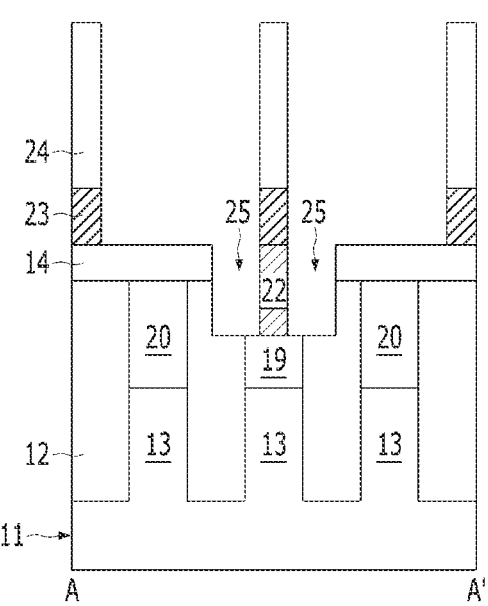
Figure 8:
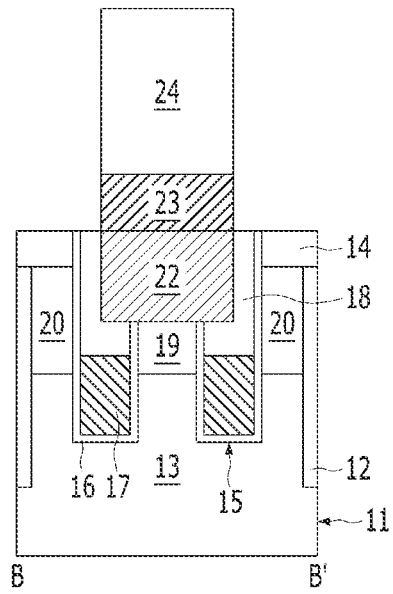

As shown in FIGS. 2 and 8, a bit line 23 and a bit line hard mask 24 may be formed. The bit line 23 and the bit line hard mask 24 may be formed by an etching process using a bit line mask layer.

The bit line hard mask layer 24A and the bit line conductive layer 23A are etched using the bit line mask layer 24A as an etch barrier. Accordingly, the bit line 23 and the bit line hard mask 24 may be formed. The bit line 23 may be formed by etching the bit line conductive layer 23A. The bit line hard mask 24 may be formed by etching the bit line hard mask layer 24A.

Subsequently, the pre-plug 22A may be etched to have the same line width as the bit line 23. Accordingly, the bit line contact plug 22 may be formed. The bit line contact plug 22 may be formed on the first impurity region 19. The bit line contact plug 22 may interconnect the first impurity region 19 and the bit line 23. The bit line contact plug 22 may be formed in the bit line contact hole 21. The line width of the bit line contact plug 22 is smaller than the diameter of the bit line contact hole 21. Accordingly, gaps 25 may be defined over both sides of the bit line contact hole 21.

As described above, since the bit line contact plug 22 is formed, a gap 25 is formed in the bit line contact hole 21. This is because the bit line contact plug 22 is etched to be smaller than the diameter of the bit line contact hole 21. The gap 25 is not formed to surround the bit line contact plug 22, but is independently formed over both sidewalls of the bit line contact hole 22. As a result, one bit line contact plug 22 and a pair of gaps 25 are positioned in the bit line contact hole 21, and the pair of gaps 25 are spaced apart by the bit line contact plug 22. A bottom surface of the gap 25 may extend into the device isolation layer 12. The lower surface of the gap 25 may be at a lower level than the recessed upper surface of the first impurity region 19.

A structure in which the bit line contact plug 22, the bit line 23, and the bit line hard mask 24 are sequentially stacked may be referred to as a bit line structure. When viewed from a top view, the bit line structure may be a line-shaped pattern structure extending in any one direction.

Figure 9:
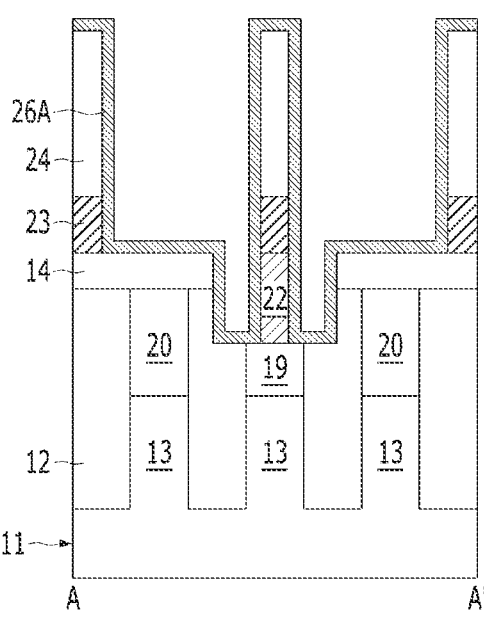
Figure 9:
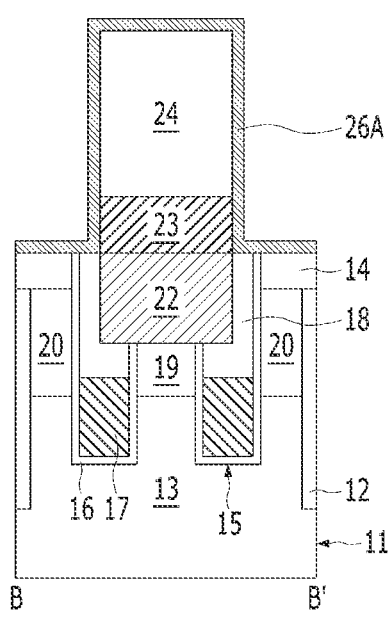

As shown in FIGS. 2 and 9, a first spacer layer 26A may be formed. The first spacer layer 26A may cover the bit line structure. The first spacer layer 26A may cover both sidewalls of the bit line contact plug 22 and both sidewalls of the bit line 23. The first spacer layer 26A may cover both sidewalls and an upper surface of the bit line hard mask 24.

The first spacer layer 26A may serve as a diffusion barrier to prevent out-diffusion of impurities in the low-k layer to be formed through a subsequent process by a thermal process or the like. The first spacer layer 26A may include silicon nitride. For example, silicon nitride may include $Si_3N_4$.

The first spacer layer 26A may be formed to have a thickness sufficient to prevent out-diffusion of impurities. The first spacer layer 26A may be formed to have a thickness that can ensure film uniformity. Here, the uniformity refers to a characteristic of maintaining a thickness sufficient to prevent out-diffusion of impurities in the low-k material layer to be formed through a subsequent process over the entire first spacer layer 26A. For example, the first spacer layer 26A may be formed to have a thickness of greater than 10 Å. In another example, the first spacer layer 26A may be formed to have a thickness of 20 Å or more.

Figure 10:
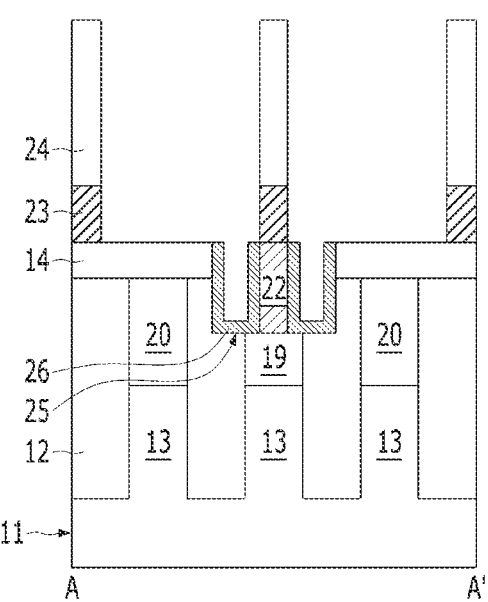
Figure 10:
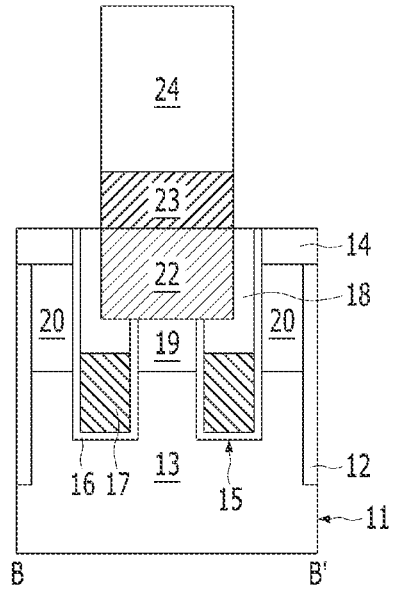

As shown in FIGS. 2 and 10, the remaining first lower spacer 26 may be formed over both sidewalls of the bit line contact plug 22. The first lower spacer 26 may be formed through a series of an etching process which selectively removes the first spacer layer 26A formed on the hard mask layer 14 which is exposed by the bit line 23, a sidewall of the bit line hard mask 24, and the bit line structure and which leaves the first spacer layer 26A only in the inside of the gap 25. The first spacer layer 26A may be formed through an isotropic etching process. Before etching the first spacer layer 26A, a protective material may be gap-filled on the upper portion of the first spacer layer 26A inside the gap 25, and the first spacer layer 26A inside the gap 25 may be prevented from being damaged during an etching process.

Figure 11:
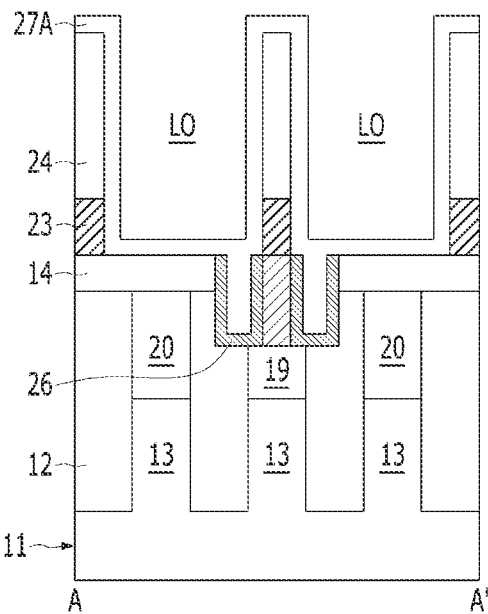
Figure 11:
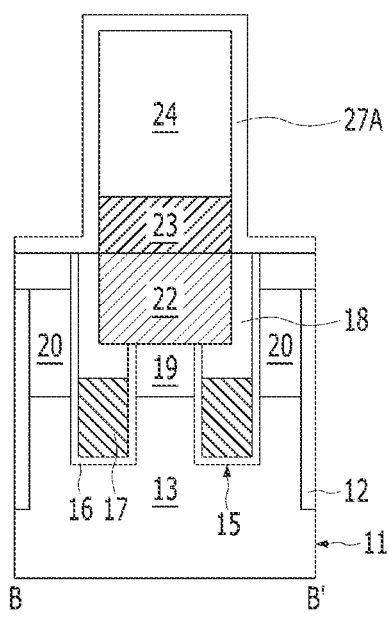

As shown in FIGS. 2 and 11, a low-k material layer 27A covering the first lower-spacer 26, the bit line 23, and the bit line hard mask 24 may be formed. The low-k material layer 27A may be formed to have a thickness that fills the gap 25.

The low-k material layer 27A may have a lower dielectric constant than the first lower spacer 26. The low-k material layer 27A may include a low-k material. The low-k material layer 27A may have a lower dielectric constant than that of silicon oxide.

The low-k material layer 27A may include an impurity-containing silicon-based material. The low-k material layer 27A may have a lower dielectric constant than the first lower spacer 26 as it contains impurities. The low-k material layer 27A may include carbon as an impurity. For example, the low-k material layer 27A may include SiCO.

Figure 12:
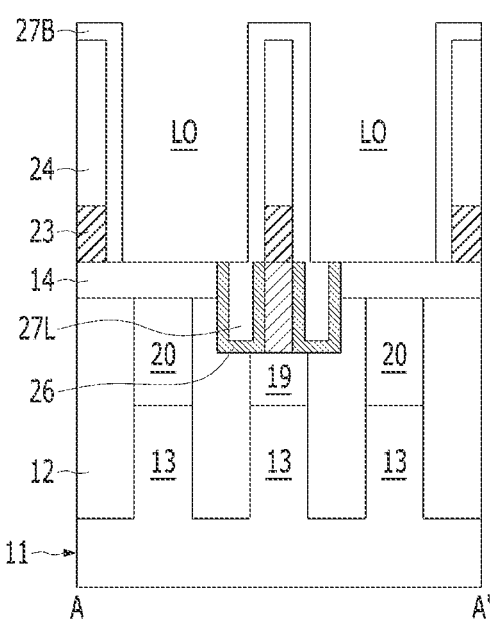
Figure 12:
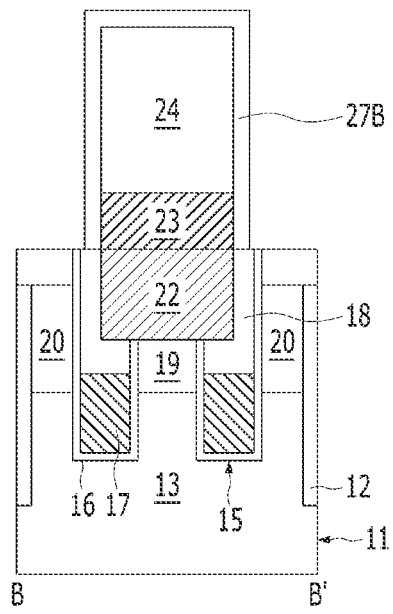

As shown in FIGS. 2 and 12, the low-k material layer 27A on the hard mask layer 14 may be etched so that the hard mask layer 14 between the bit line structures is exposed.

The low-k material layer 27A formed on the first lower-spacer 26 on the sidewall of the bit line contact plug 22 may be the second lower-spacer 27L.

The etched low-k material layer 27A positioned at a level higher than the upper surface of the hard mask layer 14 is denoted by reference numeral 27B.

As the low-k material layer 27A is etched, a line-shaped opening LO may be defined between neighboring bit lines 23.

Figure 13:
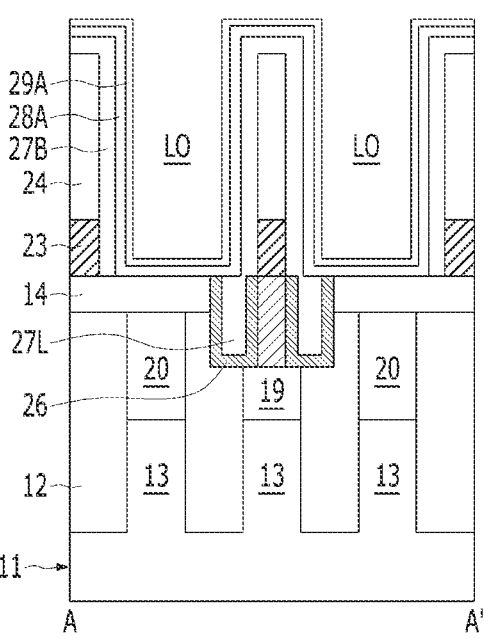
Figure 13:
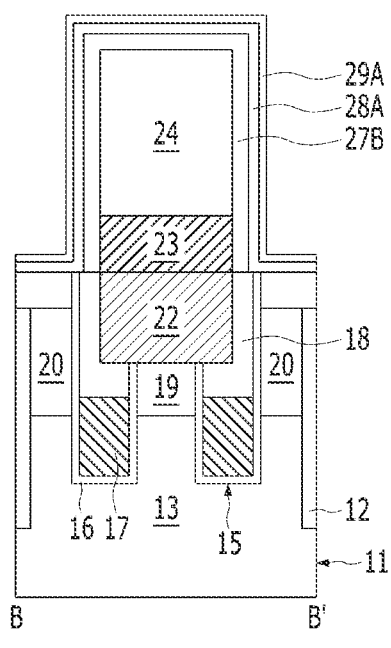
Figure 14:
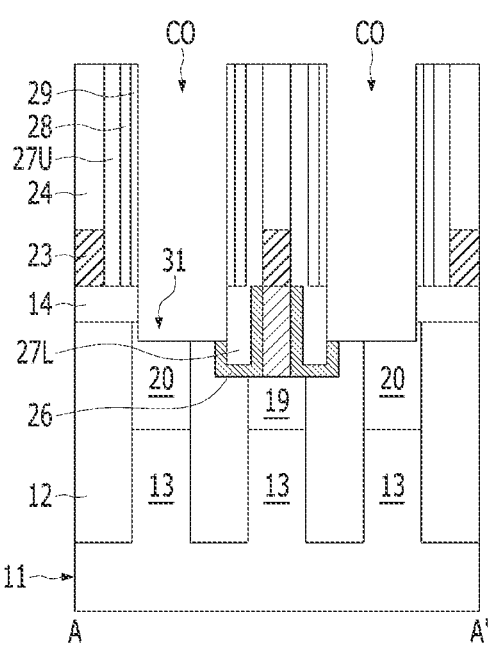
Figure 14:
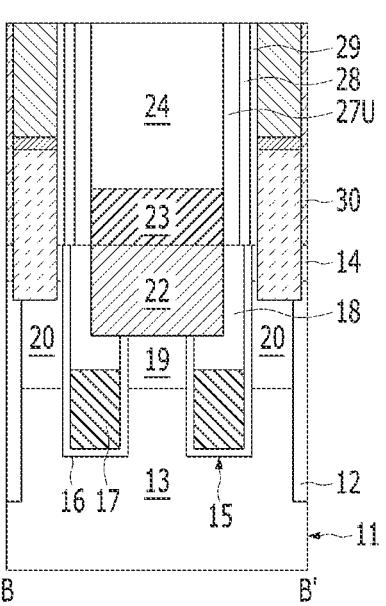

As shown in FIGS. 2, 13, and 14, a second upper spacer layer 28A may be formed along the entire surface. The second upper spacer layer 28A may include the low-k material layer 28B. The second upper spacer layer 28A may include silicon oxide.

Subsequently, a third upper spacer layer 29A may be formed on the second upper spacer layer 28A. The third upper spacer layer 29A may include silicon nitride.

Subsequently, a plurality of plug isolation layers 30 may be formed. The plug isolation layers 30 may separate the line-shaped openings LO between the bit line structures into a plurality of contact openings CO, respectively. Referring to FIG. 2, in the A-A direction, the plug isolation layers 30 (219 of FIG. 2) may vertically overlap the buried word line 17 over the buried word line 17 (207 of FIG. 2), respectively. The plug isolation layers 30 may include silicon nitride or a low-k material. In another embodiment, a portion of the bit line hard mask 24 may be consumed while forming the plug isolation layers 30.

To form the plug isolation layers 30, a sacrificial material, such as oxide, filling between the line-shaped openings LO may be formed on the third upper spacer layer 29A. In addition, a line-shaped mask pattern extending in a direction perpendicular to the bit line structure may be formed on the sacrificial material and the bit line structure. Then, the sacrificial material may be etched by using the mask pattern and the bit line structure, and the plug isolation material may be gap-filled in the region where the sacrificial material is etched. Thereafter, a plurality of contact openings CO may be formed between the plug isolation layers 30 by removing the residual sacrificial material.

Referring to FIG. 2, when viewed from a top view, the contact openings CO and the plug isolation layers 30 may be alternately formed between the adjacent bit lines 23 in the extending direction of the bit line 23 (213 of FIG. 2). Neighboring contact openings CO may be arranged in a shape being isolated by the bit line structure and the plug isolation layers 30. The contact opening CO may have a rectangular hole shape when viewed from a top view.

The underlying materials may be etched to be self-aligned to the contact openings CO. Accordingly, a plurality of recess regions 31 exposing a portion of the active region 13 may be formed between the bit line structures. Anisotropic etching or a combination of anisotropic etching and isotropic etching may be used to form the recess regions 31. For example, structures exposed through the contact openings CO may be sequentially anisotropically etched between the bit line structures, and then a portion of the exposed active region 13 may be isotropically etched. In another embodiment, the hard mask layer 14 may also be isotropically etched. Portions of the active region 13 may be exposed by the recess regions 31.

The recess regions 31 may extend into the substrate 11. During the formation of the recess regions 31, the device isolation layer 12, the gate capping layer 18, and the second impurity region 20 may be recessed to a predetermined depth. The bottom surface of the recess regions 31 may be at a lower level than the top surface of the bit line contact plugs 22. The bottom surface of the recess regions 30 may be at a higher level than the bottom surface of the bit line contact plugs 22. The contact openings CO and the recess regions 31 may be interconnected. A vertical structure of the contact openings CO and the recess regions 31 may be referred to as a 'storage node contact hole.'

An insulating structure (or a spacer structure) may be formed on the sidewall of the bit line structure by etching to form the recess regions 31. The insulating structure may include materials having different dielectric constants and different silicon contents.

In particular, the insulating structure of this embodiment may be different from the spacer structure formed over both sidewalls of the bit line contact plug 22 and the stacked structure of the spacer structure formed over both sidewalls of the bit line 23 and the bit line hard mask 24.

A stacked structure of the first lower-spacer 26 and the second lower-spacer 27L may be formed over both sidewalls of the bit line contact plug 22, that is, the gap 25, and a stacked structure of the first upper spacer 27U, the second upper spacer 28, and the third upper spacer 29 may be formed over both sidewalls of the bit line 23 and the bit line hard mask 24.

Figure 15:
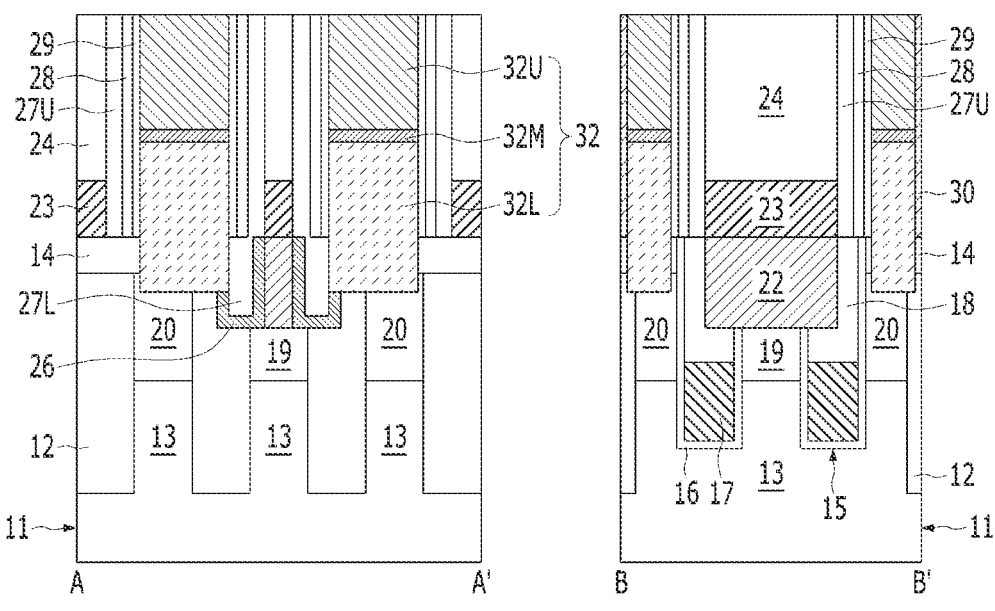

As shown in FIG. 15, a storage node contact plug 32 may be formed. The storage node contact plug 32 may fill the contact openings CO and the recess regions 31. The storage node contact plug 32 may contact the second impurity region 20. The storage node contact plug 32 may be disposed adjacent to the bit line structure. When viewed from the top view, a plurality of storage node contact plugs 32 may be positioned between the plurality of bit line structures. In a direction parallel to the bit line 23, a plurality of storage node contact plugs 32 and a plurality of plug isolation layers 30 may be alternately disposed between neighboring bit lines 23.

In the storage node contact plug 32, a lower plug 32L, an ohmic contact layer 32M, and an upper plug 32U may be sequentially stacked.

The lower plug 32L may include a silicon-containing material. The lower plug 32L may include polysilicon. Polysilicon may be doped with impurities. The lower plug 32L is connected to the second impurity region 20. The upper surface of the lower plug 32L may be at a higher level than the upper surface of the bit line 23. After polysilicon is deposited to fill the contact opening CO and the recess region 31 to form the lower plug 32L, planarization and etch-back processes may be sequentially performed.

An ohmic contact layer 32M may be formed on the lower plug 32L. The ohmic contact layer 32M may include metal silicide. Deposition and annealing of a silicideable metal layer are performed to form the ohmic contact layer 32M. Accordingly, silicidation occurs at the interface between the silicideable metal layer and the lower plug 32L, thereby forming a metal silicide layer. The ohmic contact layer 32M may include cobalt silicide. In this embodiment, the ohmic contact layer 32M may include cobalt silicide on 'CoSi$_2$'.

If cobalt silicide of a CoSi$_2$ phase is formed as the ohmic contact layer 32M, contact resistance can be improved and cobalt silicide of low-resistivity may be formed.

An upper plug 32U is formed on the ohmic contact layer 32M. Gap-filling and planarization of a metal may be performed to form the upper plug 32U. The upper plug 32U may include a metal-containing layer. The upper plug 32U may include a material containing tungsten. The upper plug 32U may include a tungsten layer or a tungsten compound. In another embodiment, the upper end of the upper plug 32U may extend to overlap the upper surface of the bit line hard mask 24.

Since the lower plug 32L includes polysilicon and the ohmic contact layer 32M and the upper plug 32U include a metal, the storage node contact plug 32 may be referred to as a hybrid plug or a semi-metal plug.

Subsequently, a memory element (refer to '230' in FIG. 3A) may be formed on the upper plug 32U. In another embodiment, a landing pad may be further formed between the upper plug 32U and the memory element.

Various embodiments for the problem to be solved above have been described, but it will be apparent to those skilled in the art that various substitutions, modifications, and changes may be made thereto without departing from the spirit and scope of the present invention.

What is claimed is:

1. A semiconductor device comprising:
a bit line structure including a bit line contact plug and a bit line stacked over a substrate;
a lower spacer structure including a diffusion barrier layer and a first low-k layer sequentially stacked over both sidewalls of the bit line contact plug; and
an upper spacer structure including a second low-k layer contacted with both sidewalls of the bit line,
wherein the diffusion barrier layer is directly contacted with the both sidewalls of the bit line contact plug and includes a carbon-free silicon nitride,
wherein the second low-k layer includes silicon-based material containing a carbon impurity.

2. The semiconductor device of claim 1, wherein the first and second low-k layers have a lower dielectric constant than the diffusion barrier layer.

3. The semiconductor device of claim 1, wherein the first low-k layer includes a silicon-based material containing an impurity.

4. The semiconductor device of claim 1, wherein the first low-k layer include SiCO.

5. The semiconductor device of claim 1, wherein the diffusion barrier layer has a thickness greater than 10 Å.

6. The semiconductor device of claim 1, wherein the upper spacer structure includes a stack structure of silicon oxide and silicon nitride, and
wherein the silicon oxide is contacted to sidewalls of the second low-k layer.

7. The semiconductor device of claim 1, wherein the first low-k layer of the lower spacer structure and the second low-k layer of the upper spacer structure are integrated.

8. The semiconductor device of claim 1, wherein the first low-k layer of the lower spacer structure and the second low-k layer of the upper spacer structure are vertically extended.

9. A method of fabricating a semiconductor device, the method comprising:
forming a bit line structure including a bit line contact plug and a bit line stacked over a substrate;
forming a lower spacer structure including a diffusion barrier layer and a first low-k layer sequentially stacked over both sidewalls of the bit line contact plug; and
forming an upper spacer structure including a second low-k layer contacted with both sidewalls of the bit line,
wherein the first and second low-k layers have a same dielectric constant,
wherein the diffusion barrier layer is directly contacted with the both sidewalls of the bit line contact plug and includes a carbon-free silicon nitride,
wherein the second low-k layer includes silicon-based material containing a carbon impurity.

10. The method of claim 9, wherein the first and second low-k layers have a lower dielectric constant than the diffusion barrier layer.

11. The method of claim 9, wherein the diffusion barrier layer has a thickness greater than 10 Å.

12. The method of claim 9, wherein the forming of the lower spacer structure includes:
forming a diffusion barrier material to cover an entire surface including the bit line structure;
forming the diffusion barrier layer over both sidewalls of the bit line contact plug by etching the diffusion barrier material; and
forming a low-k material to cover an entire surface including the diffusion barrier layer.

13. The method of claim 12, wherein the etching of the diffusion barrier material is performed with isotropic etching.

14. The method of claim 9, wherein the upper spacer structure includes a stack structure of the second low-k layer, silicon oxide, and silicon nitride, and
wherein the silicon oxide is contacted to sidewalls of the second low-k layer.

15. The method of claim 9, wherein the first low-k layer of the lower spacer structure and the second low-k layer of the upper spacer structure are integrated.

16. The method of claim 9, wherein the first low-k layer of the lower spacer structure and the second low-k layer of the upper spacer structure are vertically extended.

17. The semiconductor device of claim 1, wherein the first and second low-k layers have the same dielectric constant.

* * * * *